(12) United States Patent
Wu

(10) Patent No.: US 6,462,375 B1
(45) Date of Patent: Oct. 8, 2002

(54) SCALABLE DUAL-BIT FLASH MEMORY CELL AND ITS CONTACTLESS FLASH MEMORY ARRAY

(75) Inventor: Ching-Yuan Wu, Hsinchu (TW)

(73) Assignee: Silicon Based Technology Corp., Taiwan ( * ) Notice: Subject to any disclaimer, the term of this patent is extended or adjusted under 35 U.S.C. 154(b) by 0 days.

(21) Appl. No.: 10/109,873

(22) Filed: Apr. 1, 2002

(51) Int. Cl.[7] .............................................. H01L 29/788
(52) U.S. Cl. ........................ 257/316; 257/320; 257/326
(58) Field of Search ................................. 257/315, 316, 257/319, 320, 326

(56) References Cited

U.S. PATENT DOCUMENTS

| | | | |
|---|---|---|---|
| 5,364,806 A | 11/1994 | Ma et al. ..................... 438/266 |
| 5,654,917 A | 8/1997 | Ogura et al. ............ 365/185.18 |
| 5,864,501 A | * 1/1999 | Lee .............................. 257/319 |
| 5,989,960 A | 11/1999 | Fukase ........................ 438/267 |
| 6,051,860 A | 4/2000 | Odanaka et al. ............. 257/316 |
| 6,091,633 A | * 7/2000 | Cernea et al. ............... 257/315 |
| 6,133,098 A | 10/2000 | Ogura et al. ................. 438/267 |
| 6,151,248 A | * 11/2000 | Harari et al. ................ 257/315 |
| 6,248,633 B1 | 6/2001 | Ogura et al. ................. 438/267 |
| 6,281,545 B1 | * 8/2001 | Liang et al. ................. 257/320 |
| 6,329,248 B1 | 12/2001 | Yang ............................ 438/267 |

* cited by examiner

Primary Examiner—Chandra Chaudhari

(57) ABSTRACT

A scalable dual-bit flash memory cell of the present invention comprises a scalable gate region having a pair of floating-gate structures with a select-gate region being formed therebetween and a planarized control/select-gate over a second gate-dielectric layer being formed over the pair of floating-gate structures with or without a pair of second sidewall dielectric spacers being formed over a pair of floating gates; a conductive bit line together with a first sidewall dielectric spacer being formed over a flat bed formed by a source/drain diffusion region and etched raised field-oxide layers. A contactless dual-bit flash memory array of the present invention comprises a plurality of conductive bit-lines being formed transversely to a plurality of parallel STI regions and a plurality of word lines integrated with a plurality of control-gate/select-gates of the described cells being patterned and formed transversely to the plurality of conductive bit-lines.

20 Claims, 13 Drawing Sheets

SCALABLE DUAL-BIT FLASH MEMORY CELL AND ITS CONTACTLESS FLASH MEMORY ARRAY

FIELD OF INVENTION

The present invention relates in general to a flash memory cell and its memory array and, more particularly, to a scalable dual-bit flash memory cell and its contactless flash memory array for high-density mass storage applications.

DESCRIPTION OF THE RELATED ART

A stack-gate flash memory cell is known to be a one-transistor cell, in which the gate length of a cell can be defined by using the minimum-feature-size (F) of technology used. Therefore, the stack-gate flash memory cell is often used in existing high-density flash memory system. Basically, the stack-gate flash memory cells can be interconnected to form different configurations based on the basic logic function, such as NOR, NAND and AND.

The NAND-type flash memory array is formed by interconnecting stack-gate flash memory cells in series with common-source/drain diffusion regions. The density of a NAND-type flash memory array is high, however the read speed is slow for a NAND-type flash memory array due to the series resistance of the configuration. Moreover, a NAND-type flash memory cell is programmed by Fowler-Nordheim tunneling across the thin tunneling-oxide layer between the floating-gate and the common-source/drain diffusion region and its programming speed is relatively slow.

The NOR-type flash memory array is connected with the common-source diffusion lines and each of the common-drain diffusion regions in each column being connected to a bit line through contacts. The read speed of a NOR-type flash memory array is much faster as compared to that of a NAND-type flash memory array. Moreover, a stack-gate flash memory cell in a NOR-type flash memory array is in general programmed by channel hot-electron injection and its programming speed is much faster than that of a NAND-type flash memory array. However, the cell size of a NOR-type flash memory array is about twice as compared to that of a NAND-type flash memory array due to the bit-line contact. Moreover, the programming power is larger and the programming efficiency is low for a NOR-type flash memory array due to the channel hot-electron injection as the programming method.

Another array architecture, which takes advantages of both NOR-type and NAND-type arrays, is shown in FIG. 1, in which FIG. 1A shows a cross-sectional view of a dual-bit flash memory cell and FIG. 1B shows a top plan view of FIG. 1A. As shown in FIG. 1A(a) and FIG. 1B(b), a gate region of a dual-bit flash memory cell including two stack-gate transistors 22G, 20G and a select-gate transistor 24G is formed on a semiconductor substrate 26, in which two common $N^+/N^-$ diffusion regions 22A, 20A are formed in the semiconductor substrate 26 outside of the gate region ; a select-gate line (SG) is formed above two common $N^+/N^-$ diffusion regions and two stack-gate transistors and on a gate dielectric layer 24A being formed on a semiconductor substrate 26. Since the stack-gate transistor, the select-gate transistor and the common $N^+/N^-$ diffusion region can be defined by a masking photoresist step with a minimum-feature-size F, the cell size of each bit in a dual-bit flash memory cell is 4 $F^2$ if the select-gate line and its space can be defined to be a minimum-feature-size F. Apparently, the cell size of FIG. 1 can be made to be comparable to that of a NAND-type flash memory array due to the contactless structure; the read speed of FIG. 1 is much better than that of a NAND-type flash memory array; the programming power and the programming efficiency is much better than that of a NOR-type flash memory array. However, there are several drawbacks that can be easily observed: very high capacitance between the select-gate line (SG) and the common $N^+/N^-$ diffusion regions 22A, 20A; very high capacitance between the select-gate line (SG) and the control-gate lines 22C, 20C; isolation between the common $N^+/N^-$ diffusion regions is poor for the regions outside of the select-gate region 24A; and isolation between nearby select-gate lines is very poor for the regions under the control-gate lines 22C, 20C. It should be emphasized that poor isolation between nearby select-gate lines may result in an erroneous data reading from nearby cells under the same control-gate line.

It is therefore an objective of the present invention to provide a scalable dual-bit flash memory cell having a cell size of each bit being smaller than 2 $F^2$.

It is another objective of the present invention to provide a shallow-trench-isolation structure for scalable dual-bit flash memory cells in nearby rows of an array.

It is further objective of the present invention to provide two common-source and drain conductive bus-lines for a scalable dual-bit flash memory cell with much smaller bus-line resistances and bus-line parasitic capacitances with respect to the semiconductor substrate and the word lines.

It is yet another objective of the present invention to provide a low-voltage select-gate structure for a scalable dual-bit flash memory cell.

Other objectives and advantages of the present invention will be more apparent from the following description.

SUMMARY OF THE INVENTION

A scalable dual-bit flash memory cell and its contactless flash memory array are disclosed by the present invention. The scalable dual-bit flash memory cell is formed on a semiconductor substrate of a first conductivity type having an active region formed between two shallow-trench-isolation (STI) regions, wherein the active region has a first conductive layer formed on a first gate-dielectric layer and each of STI regions has a raised field-oxide layer. The scalable dual-bit flash memory cell can be divided into three regions: a first-side region, a gate region, and a second-side region, in which the gate region is located between the first-side region and the second-side region. The first/second-side region comprises a first sidewall dielectric spacer being formed over each sidewall of the gate region and on a portion of a first/second flat bed formed by a common-source/drain diffusion region of a second conductivity type and its nearby etched raised field-oxide layers; a common-source/drain conductive bus line being formed on the first/second flat bed outside of the first sidewall dielectric spacer; and a planarized thick-oxide layer being formed over the common-source/drain conductive bus line and the first sidewall dielectric spacer. The gate region of the first embodiment comprises a pair of second sidewall dielectric spacers being formed over each sidewall of the first sidewall dielectric spacer in the first/second-side region and on the first conductive layer in the active region and the raised field-oxide layers in the STI regions; a pair of floating-gate layers being formed in the active region and being patterned by the pair of second sidewall dielectric spacers; an implant region of the first conductivity type being formed in the semiconductor substrate of the active region between the pair of floating-gate layers; and a planarized control-gate layer over a second gate-dielectric layer being formed over the exposed surfaces of the pair of second sidewall dielectric spacers, the pair of floating-gate layers, the raised field-oxide-layers, and a semiconductor surface of the implanted region. The gate region of the second embodiment comprises a pair of floating-gate layers being patterned by the pair of second sidewall dielectric spacers; an implant region of the first conductivity type being formed in the semiconductor substrate of the active region between the pair of floating-gate layers; and a planarized control-gate layer over a second gate-dielectric layer being formed over the exposed surfaces of the pair of floating-gate layers, the raised field-oxide layers, and a semiconductor surface of the implanted region. A first interconnect-metal layer is formed over the planarized thick-oxide layers or the second gate-dielectric layer in the first/second-side regions and the planarized control-gate layer in the gate region, wherein a hard masking layer including a masking dielectric layer and its two sidewall dielectric spacers is formed over the first interconnect-metal layer to simultaneously pattern and etch the first interconnect-metal layer and the planarized control-gate layer with the masking dielectric layer being aligned above the active region.

A contactless dual-bit flash memory array of the present invention is formed on a semiconductor substrate of a first conductivity type. A plurality of active regions and a plurality of parallel shallow-trench-isolation (STI) regions are formed alternately over the semiconductor substrate, wherein each of the plurality of active regions has a first conductive layer formed over a first gate-dielectric layer and each of the plurality of parallel STI regions has a raised field-oxide layer. A plurality of common bus-line regions and a plurality of gate regions are formed alternately over the semiconductor substrate and transversely to the plurality of parallel STI regions, wherein the plurality of gate regions are formed by a masking photoresist step and are therefore scalable. A plurality of common-source/drain diffusion regions of a second conductivity type are formed in the semiconductor substrate of the plurality of active regions along the plurality of common bus-line regions. A first flat bed being formed in each of the plurality of common-bus line regions is formed alternately by the common-source/drain diffusion region and the etched raised field-oxide layer. A first sidewall dielectric spacer is formed over each sidewall of the plurality of gate regions and on a portion of the first flat bed. A common conductive bus-line is formed over the first flat bed between a pair of the first sidewall dielectric spacers in each of the plurality of common bus-line regions to act as a bit line. A planarized thick-oxide layer is formed over the common conductive bus-line and the pair of the first sidewall dielectric spacers. A plurality of paired floating-gate layers being formed by the first conductive layers in the active regions of each of the plurality of gate regions are patterned by a pair of second sidewall dielectric spacers formed over each inner sidewall of the gate region and on a flat surface being alternately formed by the first conductive layer and the raised field-oxide layer. A plurality of implanted regions being formed in a self-aligned manner in the semiconductor substrate of the active regions between the pair of second sidewall dielectric spacers, wherein each of the plurality of implanted regions comprises a shallow implant region of the first conductivity type for threshold-voltage adjustment and a deep implant region of the first conductivity type for forming a punch-through stop. A plurality of planarized control/select-gate layers together with a plurality of first interconnect-metal layers being formed over a second gate-dielectric layer are simultaneously patterned and etched to form a plurality of word lines transversely to the bit lines by using a set of hard masking layers, wherein each of the hard masking layers being formed on each of the plurality of first interconnect-metal layers comprises a masking dielectric layer being aligned above the active region and two sidewall dielectric spacers being formed over sidewalls of the masking dielectric layer. Similarly, the scalable dual-bit flash memory cell in the contactless dual-bit flash memory array of the present invention may have two floating-gate structures as described.

BRIEF DESCRIPTION OF THE DRAWINGS

FIG. 1A and FIG. 1B show the schematic diagrams of the prior art, in which

FIG. 1A shows a cross-sectional view of a dual-bit flash memory cell and

FIG. 1B shows a top plan view of a dual-bit flash memory cell shown in FIG. 1A.

FIG. 2A(*b*) shows a cross-sectional view of a scalable dual-bit flash memory cell along the A–A' line shown in FIG. 2B for the second embodiment of the present invention; FIG. 2B shows a top plan view of a contactless dual-bit flash memory array of the present invention; and FIG. 2C shows a schematic circuit diagram of a contactless dual-bit flash memory array of the present invention.

DETAILED DESCRIPTION OF THE PREFERRED EMBODIMENTS

Figure 1A:
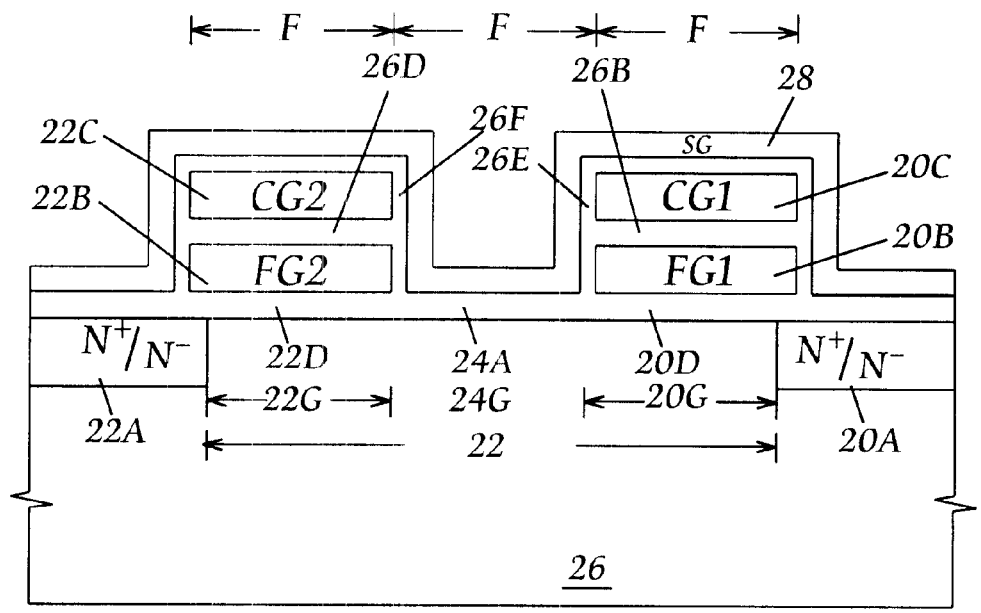
Figure 1B:
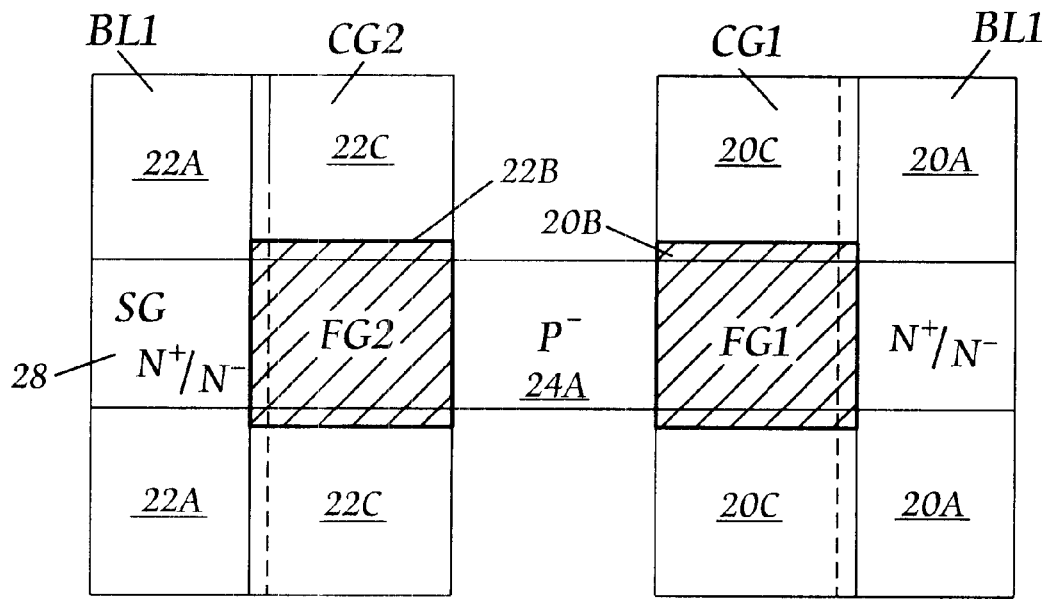
Figure 2A:
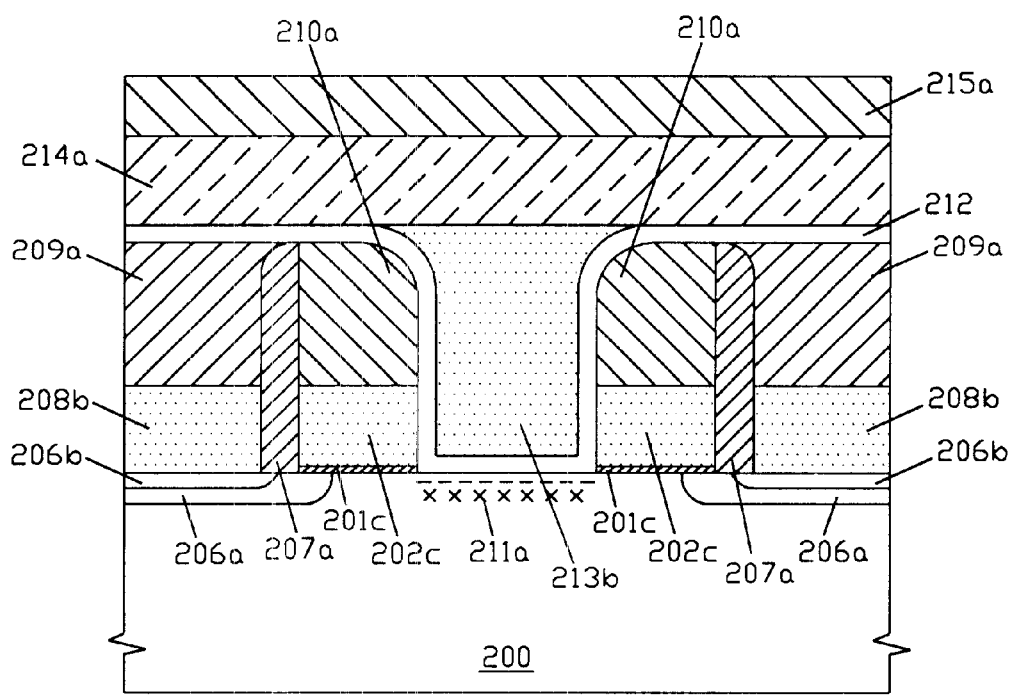
FIG. 2A through FIG. 2C show the schematic diagrams of the present invention, in which FIG. 2A(*a*) shows a cross-sectional view of a scalable dual-bit flash memory cell along the A–A' line shown in FIG. 2B for the first embodiment of the present invention.
Figure 2A:
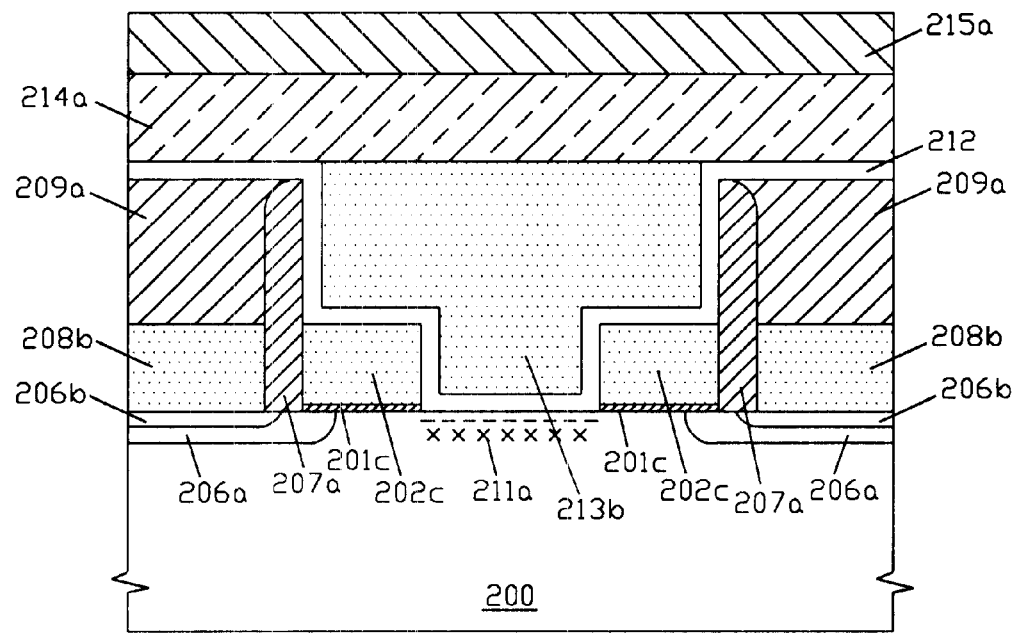

Referring now to FIG. 2A(*a*) and FIG. 2A(*b*), there are shown the cross-sectional views of two scalable dual-bit flash memory cells of the present invention. FIG. 2A(*a*) shows a cross-sectional view of a scalable dual-bit flash memory cell for the first embodiment of the present invention and FIG. 2A(*b*) shows a cross-sectional view of a scalable dual-bit flash memory cell for the second embodiment of the present invention. From FIG. 2A(*a*), a scalable dual-bit flash memory cell can be divided into three regions: a first-side region, a gate region , and a second-side region, in which the gate region is located between the first-side region and the second-side region. The gate region includes a pair of floating-gate layers 202*c* being located in each side portion of the gate region and formed on a first gate-dielectric layer 201*c*, respectively, and a select-gate region being formed between the pair of floating-gate layers 202c, wherein the gate-length of each floating-gate layer 202c is defined and patterned by a second sidewall dielectric spacer 210a formed over a sidewall of the first/second-side region. The first/second-side region comprises a first sidewall dielectric spacer 207a being formed over each sidewall of the gate region and on a portion of a flat bed being formed by a shallow heavily-doped diffusion region 206b of a second conductivity type within a common-source/drain diffusion region 206a of a second conductivity type and two etched raised field-oxide layers 204c (not shown), a common-source/drain conductive bus-line 208b being formed on the flat bed outside of the first sidewall dielectric spacer 207a, and a planarized thick-oxide layer 209a being formed on the common-source/drain conductive bus line 208b and the sidewall dielectric spacer 207a. The common source/drain diffusion region 206a of a second conductivity type is formed by implanting doping impurities in a self-aligned manner into a semiconductor substrate 200 of a first conductivity type in the active region of the first/second-side region and can be lightly-doped, moderately-doped, or heavily-doped. The select-gate region comprises an implanted region 211a having a shallow implant region (dash line) for threshold-voltage adjustment and a deep implant region (cross symbol) for forming a punch-through stop. A second gate-dielectric layer 212 is formed over the semiconductor substrate 200 of the active region in the select-gate region, the raised field-oxide layers 204b, the sidewalls of the floating-gate structures, and the planarized thick-oxide layers 209a in both first and second-side regions. A planarized third conductive layer 213b is formed over the second gate-dielectric layer 212. The third masking dielectric layer 215a and its two sidewall dielectric spacers 216a (not shown) are used to simultaneously pattern and etch the first interconnect- metal layer 214a and the planarized third conductive layer 213b for forming a word line transversely to the common-source/drain conductive bus lines 208b being acted as the bit lines. The detailed cross-sectional views in each region will be discussed in FIG. 5A(a) through FIG. 5A(c) for FIG. 2A(a).

From FIG. 2A(b), it is clearly seen that a pair of second sidewall dielectric spacers 210a shown in FIG. 2A(a) are removed, FIG. 2A(b) can be easily obtained. The detailed cross-sectional views in each region will be discussed in FIG. 5B(a) through FIG. 5B(c) for FIG. 2A(b). Compared between FIG. 2A(a) and FIG. 2A(b), the coupling ratio of FIG. 2A(b) is much larger than that of FIG. 2A(a).

Figure 2B:
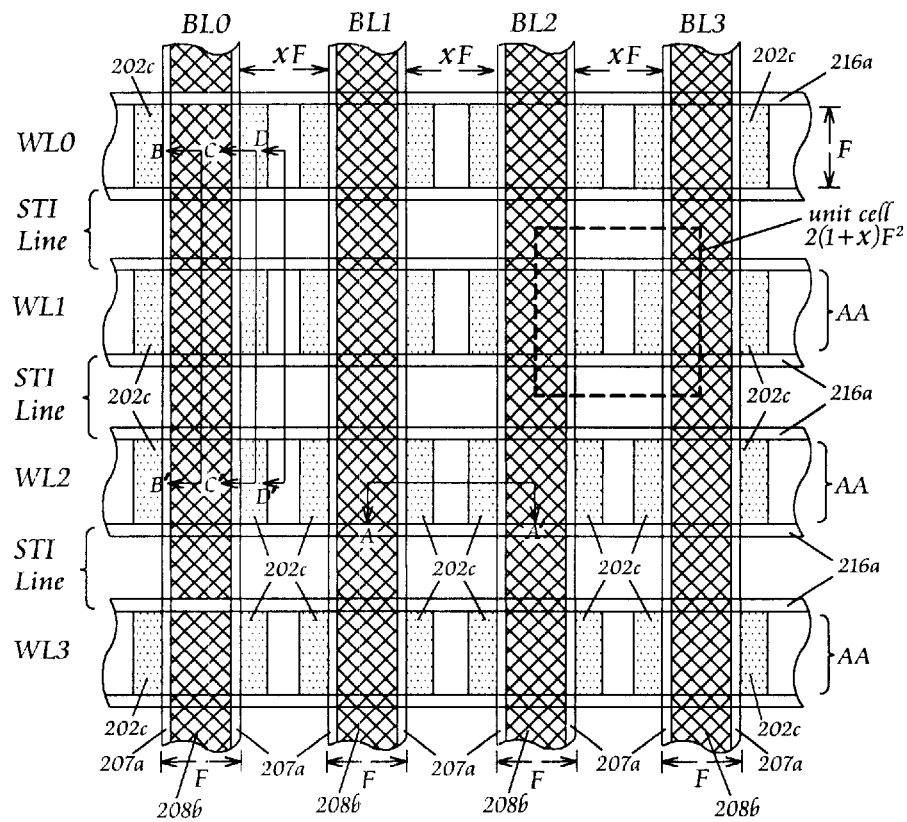
Figure 5A:
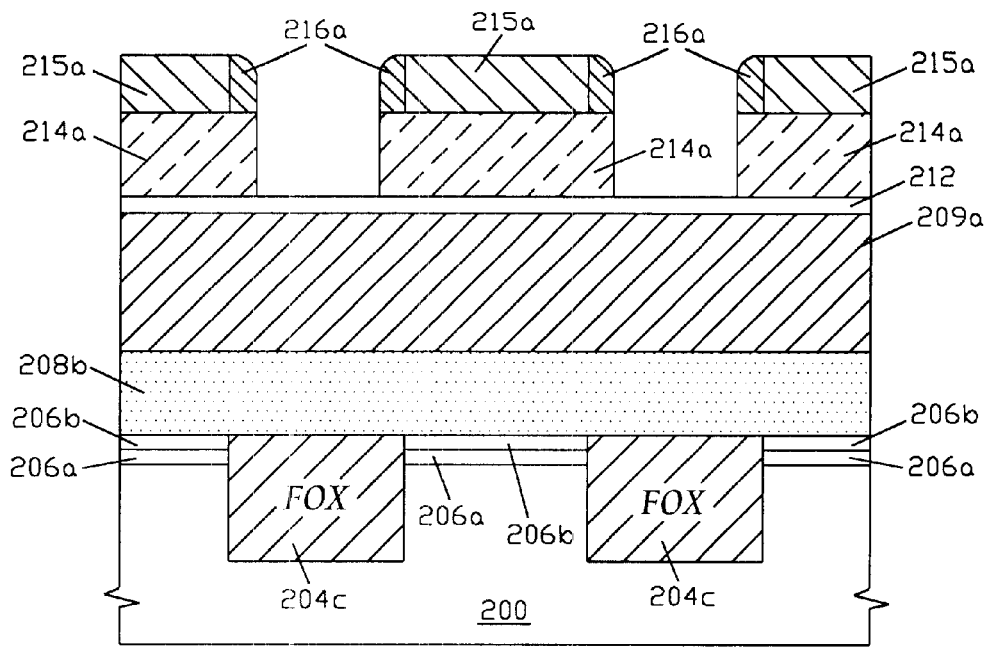
FIG. 5A(*a*) through FIG. 5A(*c*) show the cross-sectional views of a contactless dual-bit flash memory array of the present invention shown in FIG. 4I(*a*).
Figure 5A:
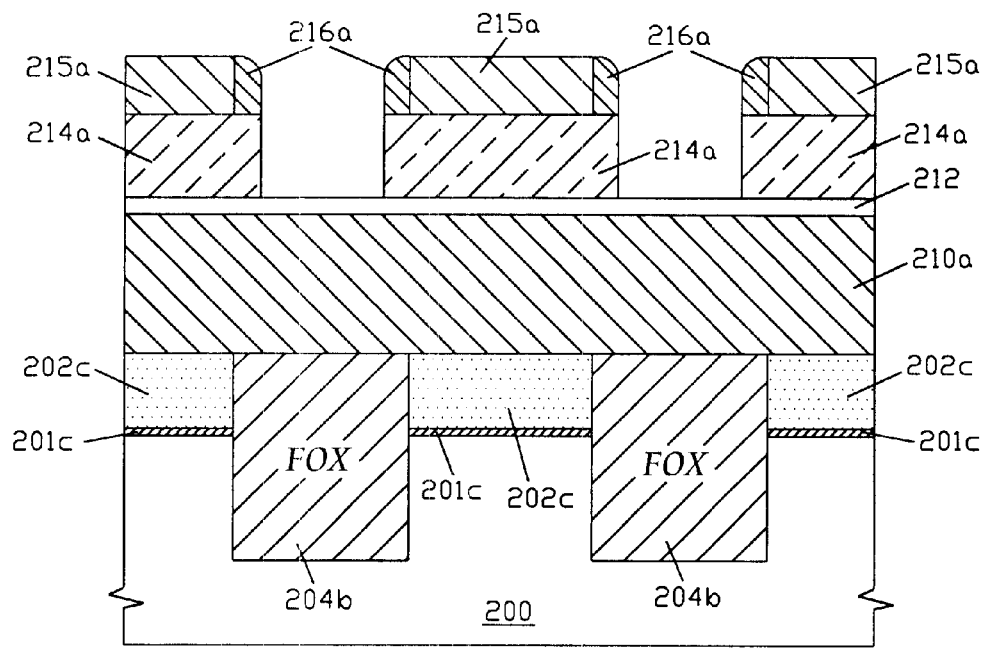
Figure 5A:
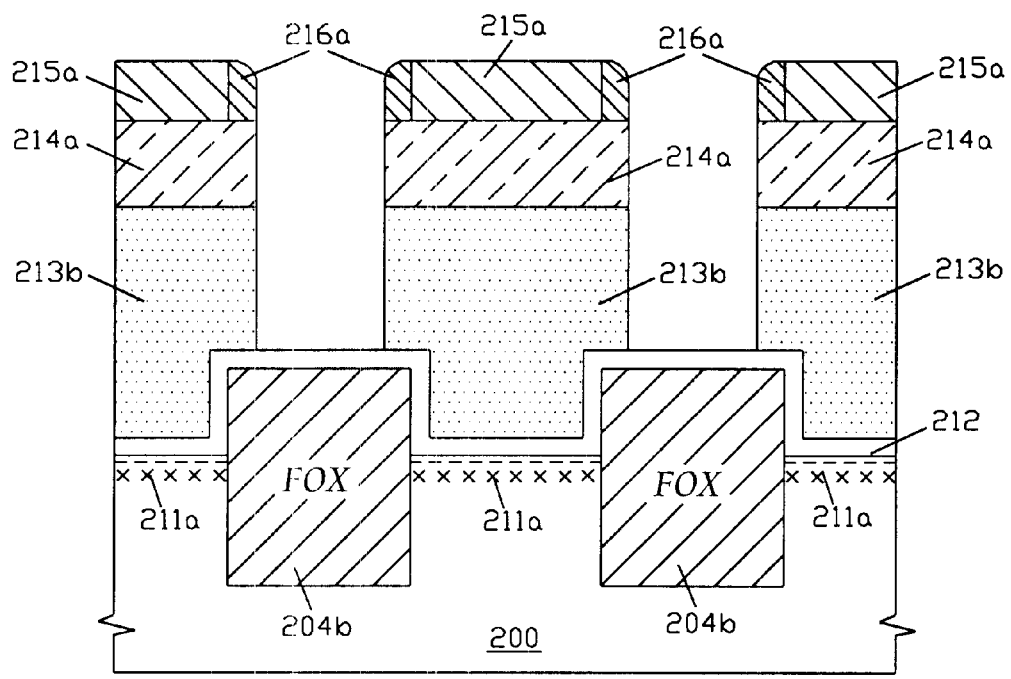

FIG. 2B shows a top plan view of a contactless dual-bit flash memory array of the present invention, in which a cross-sectional view of a scalable dual-bit flash memory cell along the A–A' line is shown in FIG. 2A(a) and FIG. 2A(b). From FIG. 2B, a plurality of parallel shallow-trench-isolation regions (STI lines) and a plurality of active regions (AAs') are formed alternately on a semiconductor substrate 200 of a first conductivity type, wherein each of the plurality of parallel STI regions is filled with a raised field-oxide layer 204b and each of the plurality of active regions is filled with a first conductive layer 202a being formed over a first gate-dielectric layer 201a; a plurality of common-source/drain bus-line regions (BL's) and a plurality of gate regions are alternately formed and are transversely to the plurality of parallel STI regions, wherein each of the plurality of common-source/drain bus-line regions comprises a flat bed being alternately formed by the etched raised field-oxide layer 204c and the common-source/drain diffusion region 206b, 206a of a second conductivity type; a pair of first sidewall dielectric spacers 207a being formed over the sidewalls of nearby gate regions; a common-source/drain conductive bus line 208b being formed over the flat bed between the pair of first sidewall dielectric spacers 207a; and a planarized thick-oxide layer 209a being formed over the common- source/drain conductive bus line 208b and the pair of first sidewall dielectric spacers 207a. Each of the gate regions comprises a plurality of scalable dual-bit flash memory cells shown in FIG. 2A(a) and FIG. 2A(b) and a plurality of first interconnect-metal lines 214a together with the planarized third conductive layers 213b are patterned and etched by using a set of hard masking layers to form a plurality of word lines (WL's) transversely to the plurality of common-source/drain conductive bus lines (BL's), wherein each of hard masking layers comprises a third masking dielectric layer 215a being aligned above the active region and two sidewall dielectric spacers 216a being formed over the sidewalls of the masking dielectric layer 215a. From FIG. 2B, the width and the space of each parallel STI region can be defined to be a minimum-feature-size F; the width of each common-source/drain bus-line region can be defined to be a minimum-feature-size F; and the width of each gate region is defined to be XF, where X is a scaling factor. The cell size of a dual-bit flash memory cell as marked by the dash square is $2(1+X) F^2$. Therefore, the cell size of each bit is $2 F^2$ for X=1, which is much smaller than that of the prior art. The cross-sectional view along the B–B' line shown in FIG. 2B is shown in FIG. 5A(a) and FIG. 5B(a); the cross-sectional view along the C–C' line shown in FIG. 2B is shown in FIG. 5A(b) and FIG. 5B(b); and the cross-sectional view along the D–D' line shown in FIG. 2B is shown in FIG. 5A(c) and FIG. 5B(c).

Figure 2C:
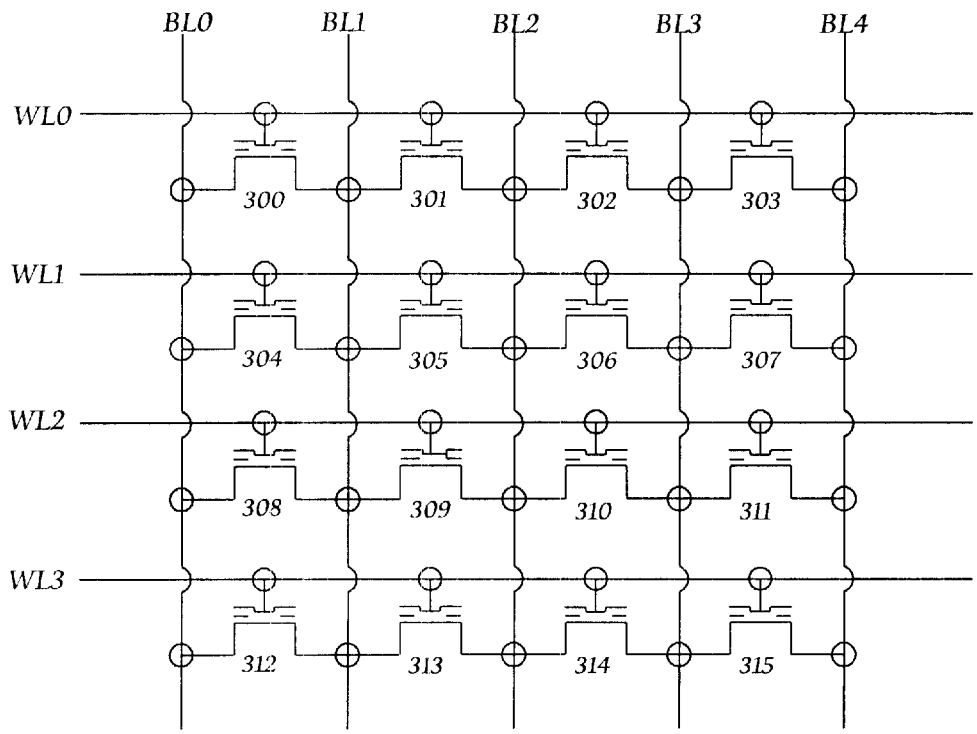

FIG. 2C shows a schematic circuit diagram of a contactless dual-bit flash memory array of the present invention, in which a plurality of scalable dual-bit flash memory cells (300~315) are formed between a plurality of common bit-lines (BL0~BL4) and a plurality of word lines (WL0~WL3) are formed transversely to the plurality of common bit-lines having each of the plurality of word lines integrated with the control select-gates of scalable dual-bit flash memory cells in each row. Each of the plurality of common bit-lines is formed by a common-source/drain conductive bus line over a flat bed being alternately formed by the common-source/drain diffusion region and the etched raised field-oxide layer; each of the plurality of word lines is formed by a first interconnect-metal layer.

According to FIG. 2A through FIG. 2C, the advantages and the features of the present invention can be summarized as below:

(a) The scalable dual-bit flash memory cells of the present invention can offer a cell size of each bit equal to $2 F^2$.

(b) The contactless dual-bit flash memory array of the present invention offers a shallow-trench-isolation (STI) structure for the scalable dual-bit flash memory cells in different columns or rows.

(c) The contactless dual-bit flash memory array of the present invention offers a common-source/drain conductive bus line for each bit line with smaller bus-line resistance and smaller bus-line capacitance with respect to the semiconductor substrate as compared to those of a buried diffusion line of the prior art.

(d) The contactless dual-bit flash memory array of the present invention offers a highly-conductive interconnect-metal layer for each word line with much smaller word-line resistance and smaller word-line capacitance with respect to the bit lines as compared to those of the prior art.

(e) The contactless dual-bit flash memory array of the present invention offers much better density-speed-power product as compared to those of a NAND-type or NOR-type flash memory array.

Figure 3A:
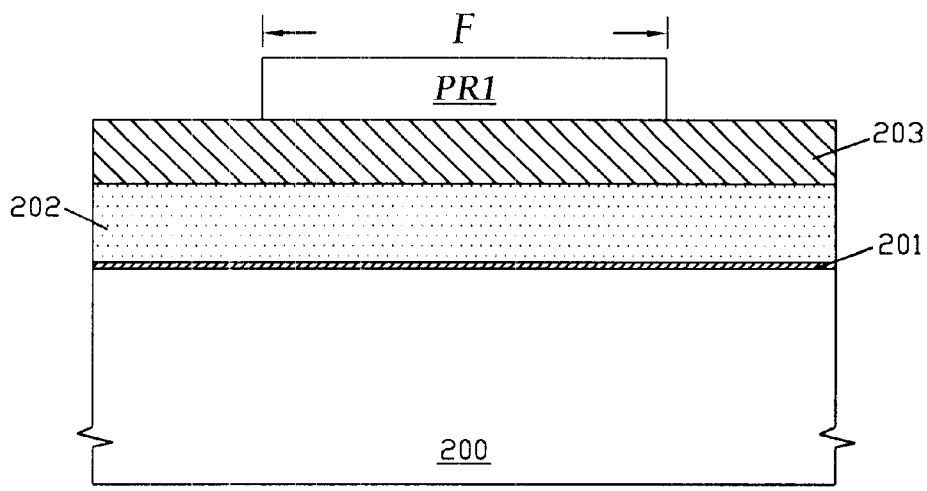
FIG. 3A through FIG. 3F show the process steps and their cross-sectional views for forming a shallow-trench-isolation structure for a scalable dual-bit flash memory cell and its contactless dual-bit flash memory array of the present invention.

Referring now to FIG. 3A through FIG. 3F, there are shown the process steps and their cross-sectional views of fabricating a shallow-trench-isolation (STI) structure for a dual-bit flash memory array of the present invention. FIG. 3A shows that a first gate-dielectric layer 201 is formed on a semiconductor substrate 200 of a first conductivity type; a first conductive layer 202 is then formed on the first gate-dielectric layer 201; a first masking dielectric layer 203 is subsequently formed on the first conductive layer 202; and then a plurality of patterned masking photoresist PR1 are formed over the first masking dielectric layer 203 to define a plurality of active regions (AA's) (under PR1) and a plurality of parallel shallow-trench-isolation (STI) regions (between PR1). It should be emphasized that FIG. 3A shows a small portion of the plot for simplicity. The first gate-dielectric layer 201 is preferably a thermal-oxide layer or a nitrided thermal-oxide layer having a thickness of between 80 Angstroms and 120 Angstroms to be acted as a thin tunneling-dielectric layer. It should be noted that the first gate-dielectric layer 201 can be a composite dielectric layer such as an oxide-nitride-oxide (ONO) structure or a nitride-oxide structure having an equivalent oxide thickness between 50 Angstroms and 100 Angstroms, in which the nitride layer is a storage element. The first conductive layer 202 is preferably a doped polycrystalline-silicon or doped amorphous-silicon layer as deposited by low-pressure chemical-vapor-deposition (LPCVD) method and its thickness is preferably between 500 Angstroms and 2500 Angstroms. The first masking dielectric layer 203 is preferably a silicon-nitride layer as deposited by LPCVD and its thickness is preferably between 500 Angstroms and 3000 Angstroms. The width and the space of the masking photoresist PR1 are preferably equal to a minimum-feature-size (F).

Figure 3B:
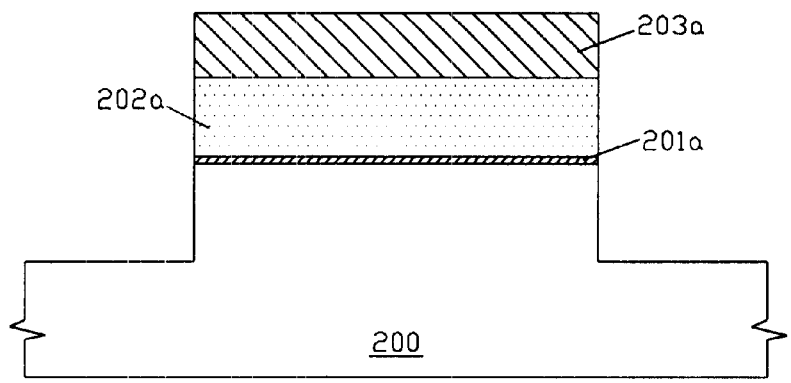

FIG. 3B shows that the first masking dielectric layer 203, the first conductive layer 202 and the first gate-dielectric layer 201 outside of the patterned masking photoresist PR1 are sequentially removed; the semiconductor substrate 200 is then etched in a self-aligned manner to form the shallow trenches; and the patterned masking photoresist PR1 are stripped. The depth of shallow trenches in the semiconductor substrate 200 is preferably between 3000 Angstroms and 8000 Angstroms.

Figure 3C:
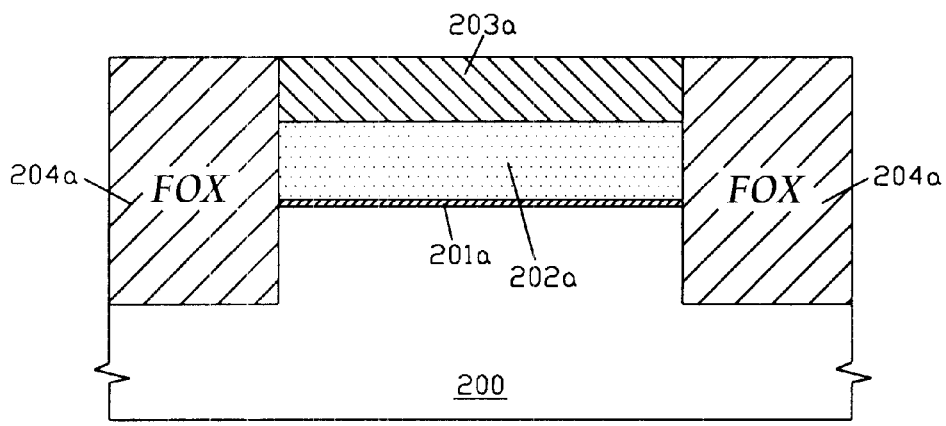

FIG. 3C shows that the planarized field-oxide layers 204a (FOX) are formed to fill up the gaps formed by the shallow trenches. The planarized field-oxide layers 204a are formed by first depositing a thick-oxide film 204 over the structure and then planarizing the deposited thick-oxide film 204 using chemical-mechanical polishing (CMP) with the first masking dielectric layer 203a as a polishing stop. The planarized field-oxide layer 204a is preferably made of silicon-oxides or phosphorosilicate glass (PSG) as deposited by high-density plasma (HDP) CVD or CVD.

Figure 3D:
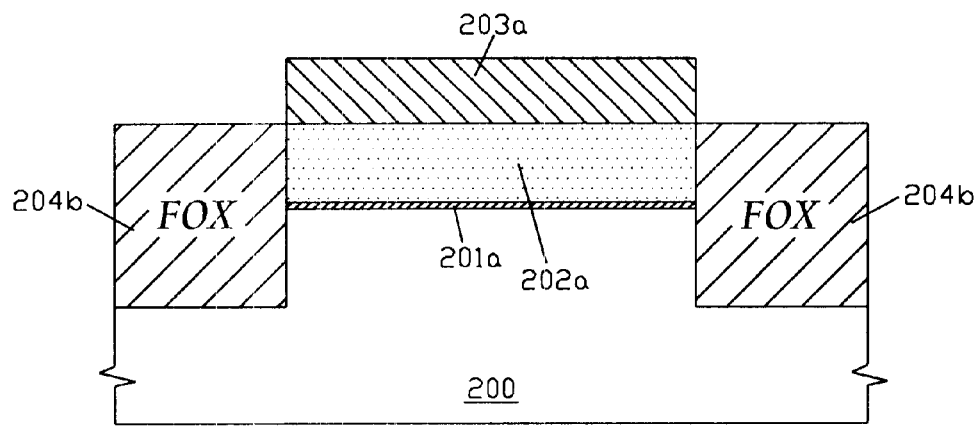

FIG. 3D shows that the planarized field-oxide layers 204a are selectively etched back to a thickness of the first masking dielectric layer 203a to form the raised field-oxide layers 204b.

Figure 3E:
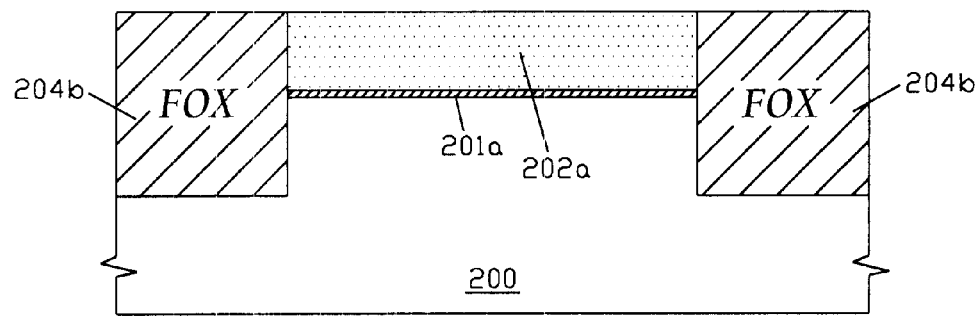

FIG. 3E shows that the first masking dielectric layers 203a are removed preferably by using hot-phosphoric acid. It is clearly seen that the surface is flat for fine-line lithography later on.

Figure 3F:
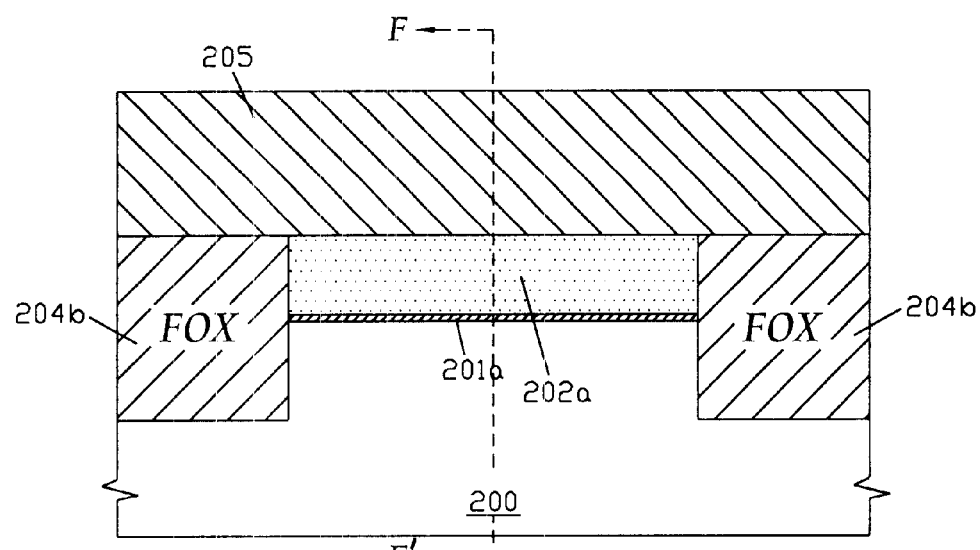

FIG. 3F shows that a second masking dielectric layer 205 is formed over a flat surface being alternately formed by the raised field-oxide layer 204b and the first conductive layer 202a. The second masking dielectric layer 205 is preferably made of silicon-nitrides as deposited by LPCVD and its thickness is preferably between 3000 Angstroms and 10000 Angstroms. The cross-sectional view along the F–F' line in an active region is shown in FIG. 4A.

Figure 4A:
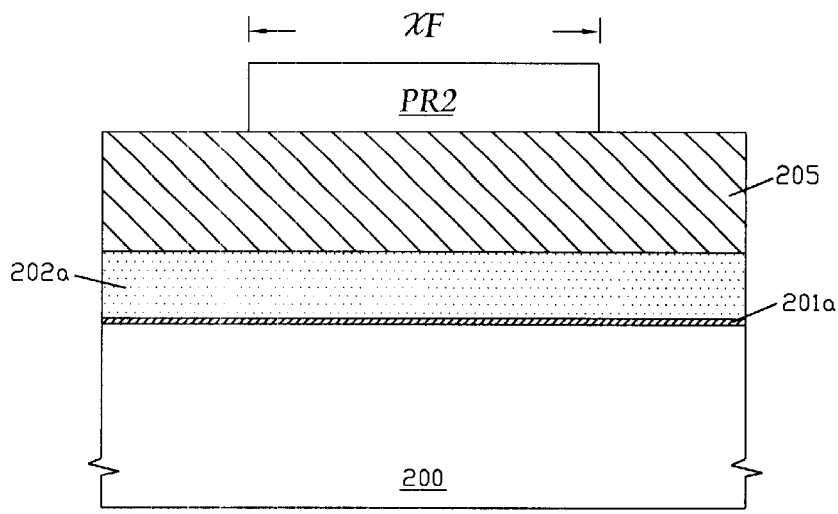
FIG. 4A through FIG. 4I show the process steps and their cross-sectional views for forming a scalable dual-bit flash memory cell and its contactless dual-bit flash memory array of the present invention.

Now, referring to FIG. 4A through FIG. 4I, there are shown the process steps and their cross-sectional views of fabricating a scalable dual-bit flash memory cell and its contactless flash memory array of the present invention. FIG. 4A shows a small portion of a memory array, in which a patterned masking photoresist PR2 is formed over the second masking dielectric layer 205 to define the gate region (under PR2) of a scalable dual-bit flash memory cell and the common-source/drain bus-line region (outside of PR2). Extending FIG. 4A in lateral direction, a plurality of the patterned masking photoresist PR2 are formed in parallel to define a plurality of gate regions and a plurality of common-source/drain bus-line regions. The width of the patterned masking photoresist PR2 is XF, where x is a scaling factor and is preferably between 1 and 3; and the space of the patterned masking photoresist PR2, which is the width of the common-source/drain bus-line regions, can be a minimum-feature-size F. Therefore, the gate region of a dual-bit flash memory cell is scalable.

Figure 4B:
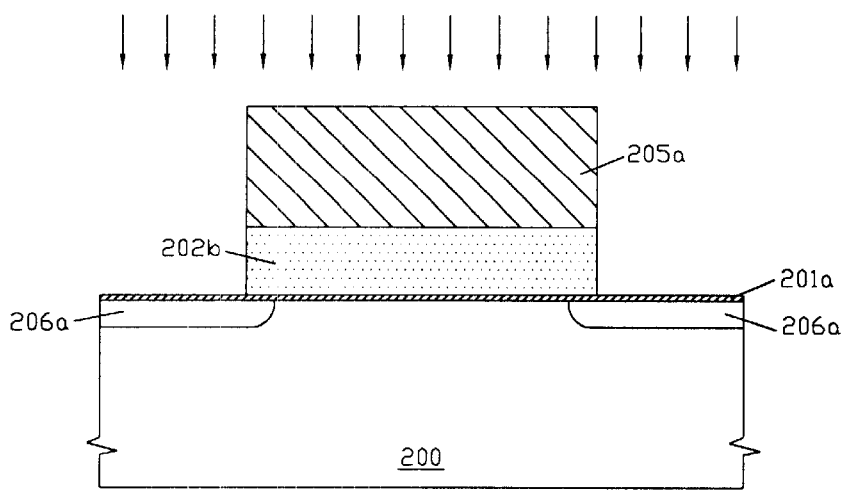

FIG. 4B shows that the second masking dielectric layers 205 outside of the patterned masking photoresist PR2 are anisotropically removed first; the raised field-oxide layers 204b are then etched back in a self-aligned manner to a depth approximately equal to a thickness of the first conductive layer 202a; subsequently, the first conductive layers 202a outside of PR2 are removed; and the patterned masking photoresist PR2 are stripped. The ion-implantation is performed in a self-aligned manner to implant doping impurities across the first gate-dielectric layer 201a into the semiconductor substrate 200 of the active regions to form a plurality of common-source/drain diffusion regions 206a of a second conductivity type. The common-source/drain diffusion regions 206a can be lightly-doped, moderately-doped or heavily-doped.

Figure 4C:
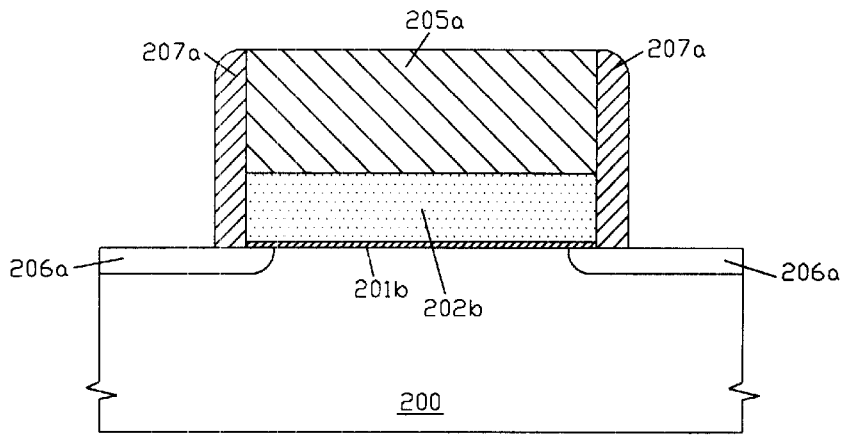

FIG. 4C shows that the first gate-dielectric layers 201a outside of the gate regions are removed by using wet etching or anisotropic dry etching to form a flat bed alternately formed by the common-source/drain diffusion region 206a and the etched raised field-oxide layer 204c; and a first sidewall dielectric spacer 207a is then formed over each sidewall of the gate region. The first sidewall dielectric spacer 207a is formed by first depositing a dielectric layer 207 over the formed structure and then etching back anisotropically the thickness of the deposited dielectric layer 207. The first sidewall dielectric spacer 207a is preferably made of silicon-oxides as deposited by LPCVD or high-temperature-oxide (HTO) deposition.

Figure 4D:
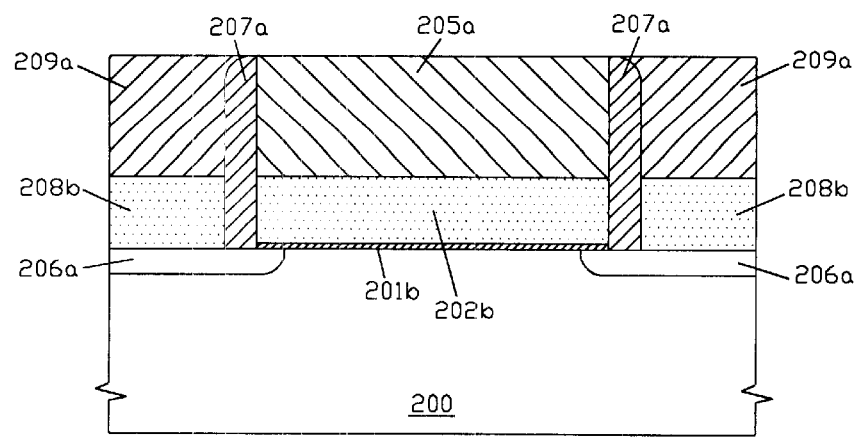

FIG. 4D shows that the planarized second conductive layers 208a are formed to fill up the gaps between a pair of first sidewall dielectric spacers 207a and then are etched back to a level approximately equal to the top surface of the first conductive layer 202b to form the common-source/drain conductive bus lines 208b; the planarized thick-oxide layers 209a are then formed to fill up the gaps formed by the etched-back planarized second conductive layers 208b. The planarized second conductive layers 208a are formed by first depositing a thick second conductive layer 208 over the formed structure and then planarizing the deposited thick second conductive layer 208 using CMP with the second masking dielectric layer 205a as a polishing stop. The planarized second conductive layer 208a is preferably made of doped polycrystalline-silicon as deposited by LPCVD and the etched-back planarized second conductive layer 208b is preferably further implanted with a high-dose of doping impurities to be acted as a dopant diffusion source for forming the heavily-doped diffusion regions 206b of a second conductivity type within the common-source/drain diffusion regions 206a. It should be noted that the etched-back planarized second conductive layer 208b may include a metal-silicide layer formed on the top through a well-known self-aligned silicidation technique or the etching back of the planarized metal-silicide layers. Similarly, the planarized thick-oxide layers 209a are formed by first depositing a thick-oxide film 209 and then planarizing the deposited thick-oxide film 209 with the second masking dielectric layer 205a as a polishing stop. The planarized thick-oxide layer 209a is preferably made of silicon-oxides as deposited by HDPCVD or CVD.

Figure 4E:
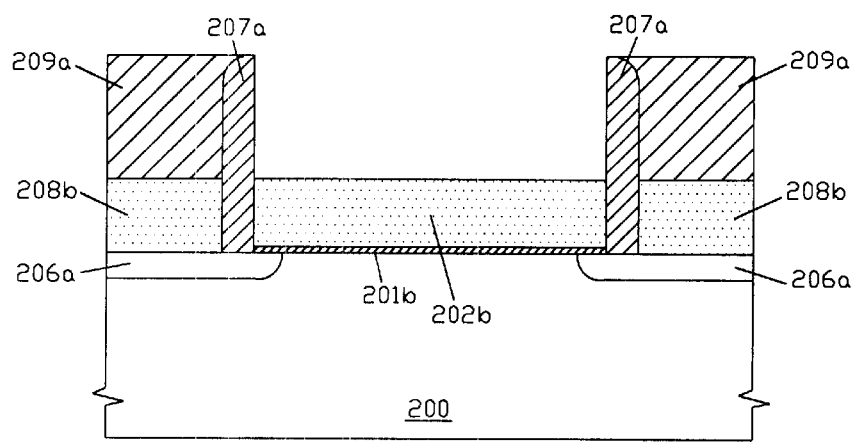

FIG. 4E shows that the second masking dielectric layers 205a are removed by using hot-phosphoric acid or anisotropic dry etching.

Figure 4F:
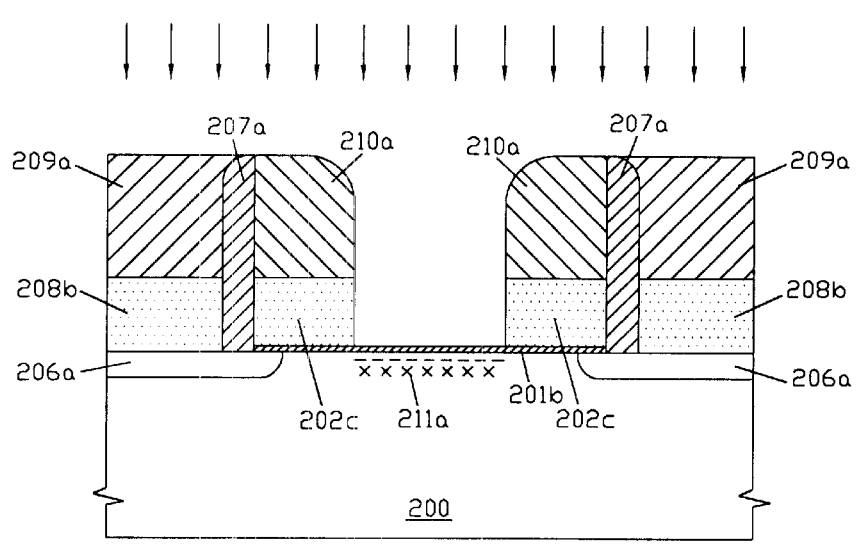

FIG. 4F shows that a pair of second sidewall dielectric spacers 210a are formed over each sidewall formed by the removed second masking dielectric layers 205a to define a pair of floating-gate layers 202c; the first conductive layers 202b between the pair of second sidewall dielectric spacers 210a are then removed by anisotropic dry etching; and the ion-implantation is performed to implant doping impurities across the first gate-dielectric layer 201b in a self-aligned manner into the central portions of the semiconductor substrate 200 in the active regions to form the implanted region 211a in each gate region. The implanted region 211a may include a shallow implant region of a first conductivity type for threshold-voltage adjustment and a deep implant region of a first conductivity type for forming a punch-through stop. The second sidewall dielectric spacer 210a is preferably made of silicon-nitrides or silicon-oxides as deposited by LPCVD.

Figure 4G:
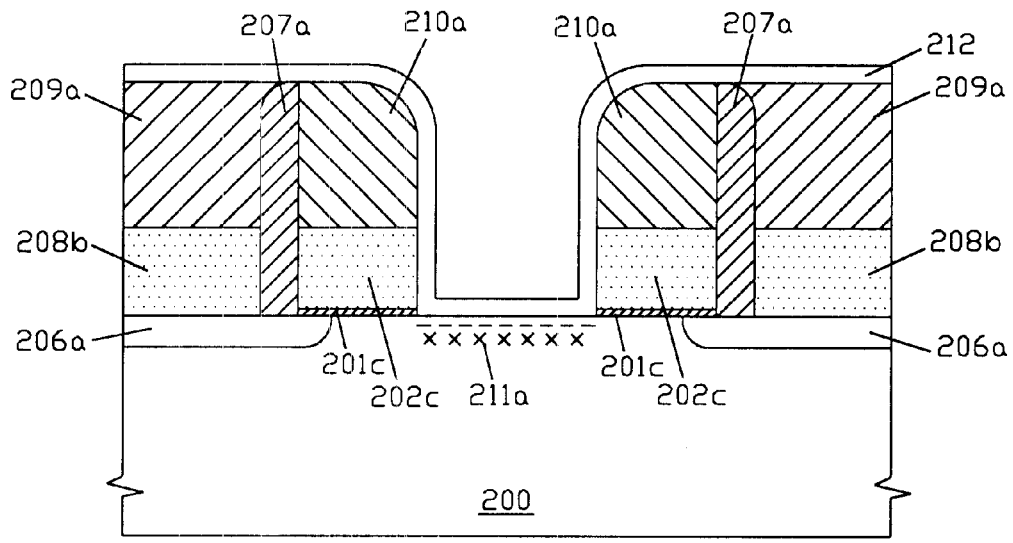
Figure 4G:
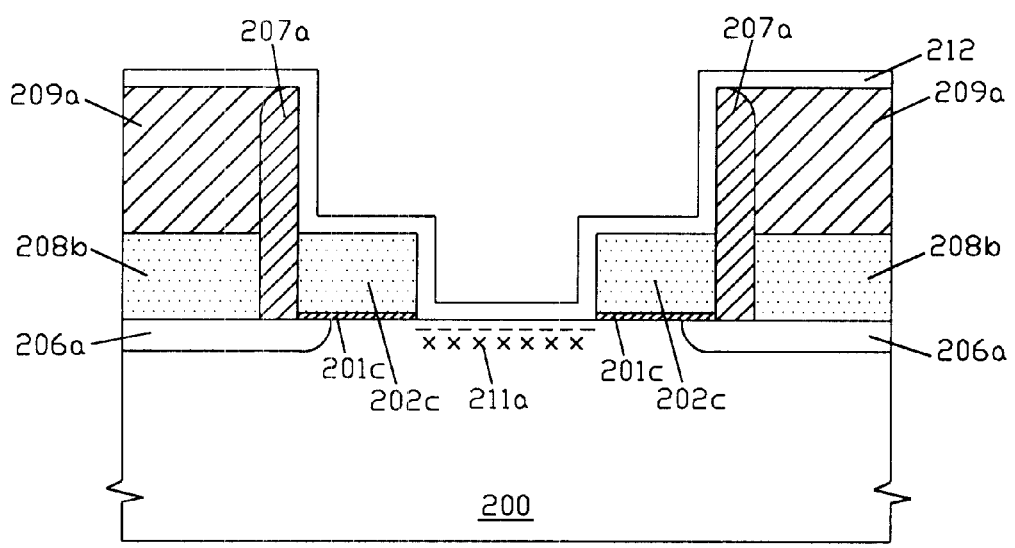

FIG. 4G(a) shows that the first gate-dielectric layers 201b between the pair of second sidewall dielectric spacers 210a in each gate region are removed by wet etching or anisotropic dry etching and the second gate-dielectric layer 212 is formed over the formed structure. FIG. 4G(b) shows that the first gate-dielectric layers 201b between the pair of first conductive layers 202c are removed by wet etching or anisotropic dry etching; the pair of second sidewall dielectric spacers 210a in each gate region are then preferably removed by hot-phosphoric acid; and subsequently the second gate-dielectric layer 212 is formed over the formed structure. The second gate-dielectric layer 212 is preferably a composite dielectric layer such as an oxide-nitride-oxide (ONO) structure or a nitride-oxide structure having an equivalent oxide thickness between 100 Angstroms and 500 Angstroms. It should be noted that the second gate-dielectric layer 212 can be a silicon-oxide layer as deposited by HTO or a thermal-oxide or nitrided thermal layer having a thickness of between 150 Angstroms and 300 Angstroms.

Figure 4H:
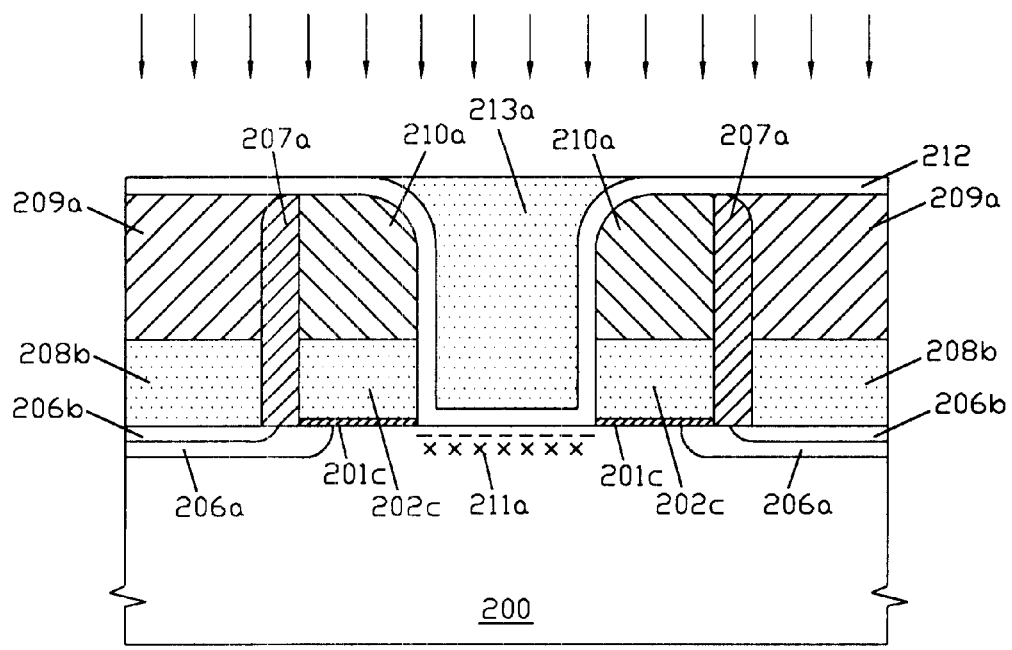
Figure 4H:
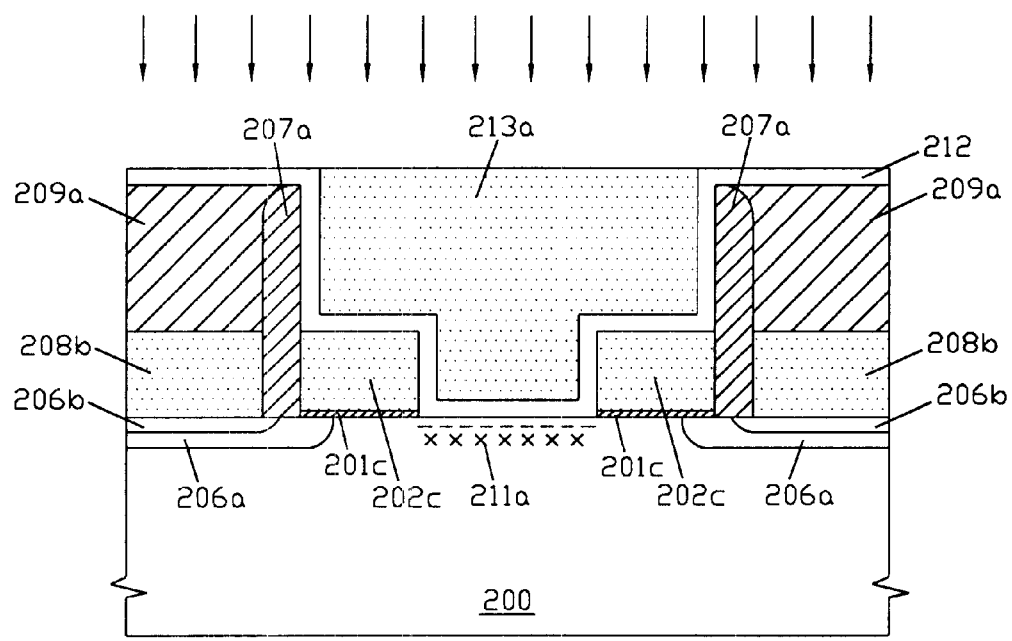

FIG. 4H(a) and FIG. 4H(b) show that the planarized third conductive layers 213a are formed over the gaps in each gate region and on the second gate-dielectric layer 212. The planarized third conductive layer 213a is formed by first depositing a thick third conductive layer 213 over the formed structure and then planarizing the deposited thick third conductive layer 213 using the second gate-dielectric layer 212 as a polishing stop. The third conductive layer 213 is preferably made of doped polycrystalline-silicon and the planarized doped polycrystalline-silicon layer 213a is further implanted with a high dose of doping impurities as shown in FIG. 4H(a) and FIG. 4H(b). It should be noted that the deposited thick third conductive layer 213 can be a composite conductive layer consisting of a thin doped polycrystalline-silicon layer capped with a thick tungsten-silicide (WSi$_2$) layer or a thin doped polycrystalline-silicon layer/silicides (TiSi$_2$ or CoSi$_2$)/barrier metal (TiN or TaN)/tungsten(W).

Figure 4I:
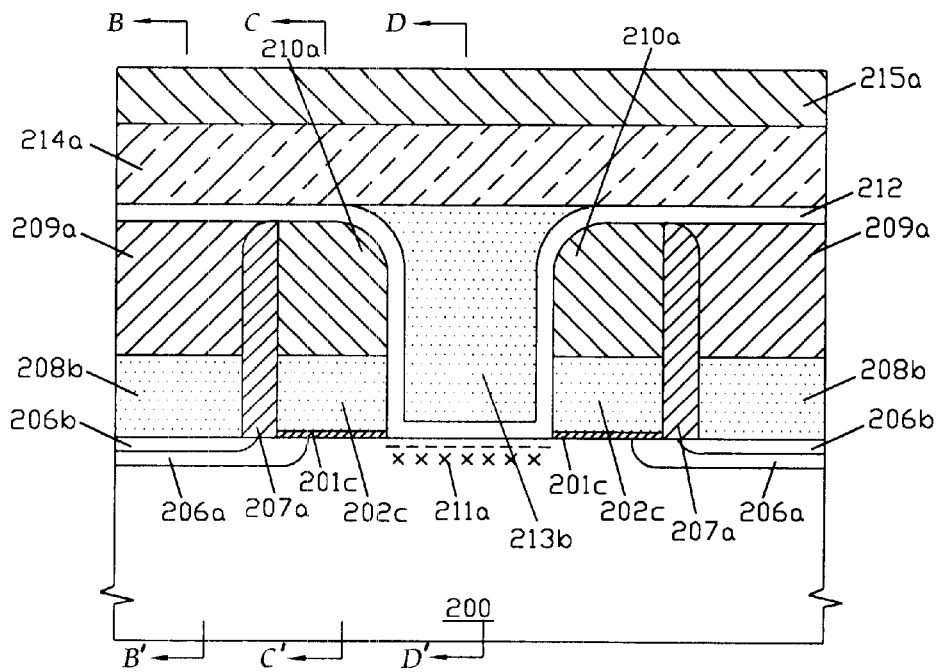
Figure 4I:
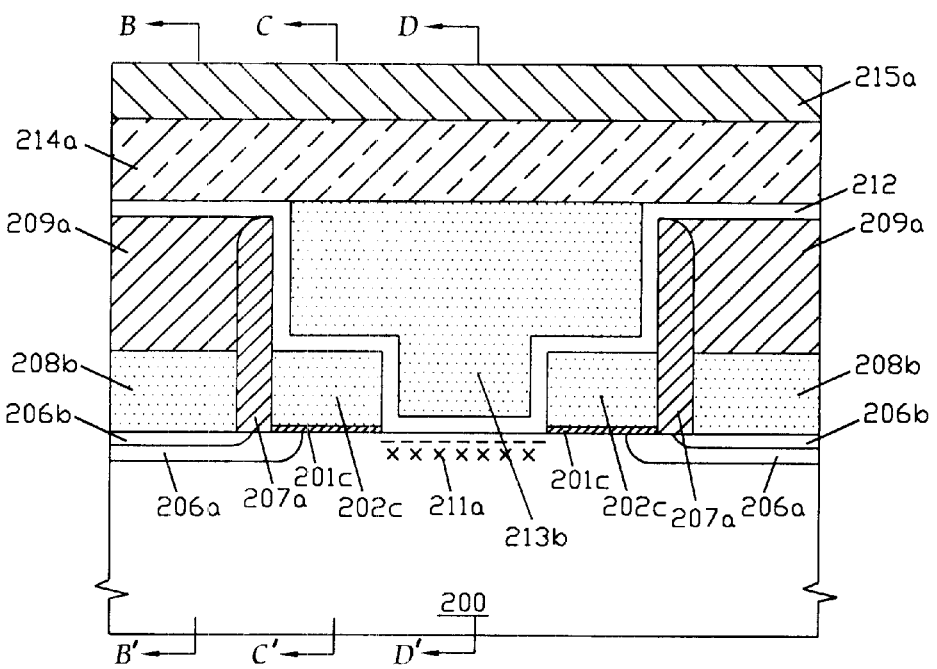

FIG. 4I(a) and FIG. 4I(b) show a first interconnect-metal layer 214 is formed over the planarized structure shown in FIG. 4H(a) and FIG. 4H(b); a third masking dielectric layer 215 is then formed over the interconnect-metal layer 214; the third masking dielectric layer 215 is patterned by a plurality of masking photoresist PR3 (not shown) to form a plurality of third masking dielectric layers 215a being aligned above the plurality of active regions (AA); and two sidewall dielectric spacers 216a being formed over the sidewalls of each third masking dielectric layer 215a (will be shown in FIG. 5) together with the third masking dielectric layers 215a form a set of hard masking layers for forming a plurality of word lines transversely to the common-source/drain conductive bus lines 208b. Each word line includes a first interconnect-metal layer 214a and a plurality of planarized third conductive layers 213b. The first interconnect-metal layer 214a includes a copper or aluminum layer formed over a barrier-metal layer such as titanium-nitrides (TiN) or tantalum-nitrides (TaN). The third masking dielectric layer 215a and its two sidewall dielectric spacers 216a are preferably made of silicon-nitrides or silicon-oxides as deposited by LPCVD. It should be noted that a silicide layer is formed over the planarized third conductive layer 213a if the planarized third conductive layer 213a is made of doped polycrystalline-silicon. The cross-sectional views shown in FIG. 4I(a) and FIG. 4I(b) are shown in FIG. 5A(a) through FIG. 5A(c) and FIG. 5B(a) through FIG. 5B(c), respectively.

FIG. 5A(a) shows a cross-sectional view along the B–B' line shown in FIG. 4I(a), in which a common-source/drain conductive bus line 208b is formed over a flat bed alternately formed by an etched raised field-oxide layer 204c and a common-source/drain diffusion region of a second conductivity type having a shallow heavily-doped diffusion region 206b formed within a deeper lightly-doped diffusion region 206a; a planarized thick-oxide layer 209a is formed over the common-source/drain conductive bus line 208b; a second gate-dielectric layer 212 is formed over the planarized thick-oxide layer 209a; and a plurality of first interconnect-metal layers 214a are patterned by a set of hard masking layers, wherein each of the hard masking layers includes a third masking dielectric layer 215a and its two sidewall dielectric spacers 216a. It should be noted that the third masking dielectric layer 215a is aligned above the active region and its two sidewall dielectric spacers 216a are used to eliminate misalignment. From FIG. 5A(a), it is clearly seen that the common-source/drain conductive bus line 208b being acted as a bit line may provide not only a lower bit-line resistance but also a lower parasitic bit-line capacitance with respect to the semiconductor substrate 200 as compared to the buried diffusion layer of the prior art. Moreover, the parasitic capacitance between the word line and the bit line of the present invention is much smaller than that of the prior art.

FIG. 5A(b) shows a cross-sectional view along the C–C' line shown in FIG. 4I(a), in which a second sidewall dielectric spacer 210a replacing the second masking dielectric layer 205a is formed on a flat surface alternately formed by the first conductive layer 202c over the first gate-dielectric layer 201c and the raised field-oxide layer 204b as shown in FIG. 3F; a second gate-dielectric layer 212 is formed over the second sidewall dielectric spacer 210a;

similarly, a plurality of first interconnect-metal layers 214a are patterned by a set of hard masking layers, in which each of hard masking layers includes a third masking dielectric layer 215a and its two sidewall dielectric spacers 216a.

FIG. 5A(c) shows a cross-sectional view along the D–D' line shown in FIG. 4I(a), in which a plurality of first interconnect-metal layers 214a and a plurality of planarized third conductive layers 213b are simultaneously patterned and etched by using a set of hard masking layers, wherein each of hard masking layers includes a third masking dielectric layer 215a being aligned above the active region and two sidewall dielectric spacers 216a being used to eliminate misalignment. It should be noted that the gaps between the word lines in FIG. 5A(a) through FIG. 5A(c) can be refilled with planarized silicon-oxide or oxynitrides as deposited by HDPCVD or CVD.

Figure 5B:
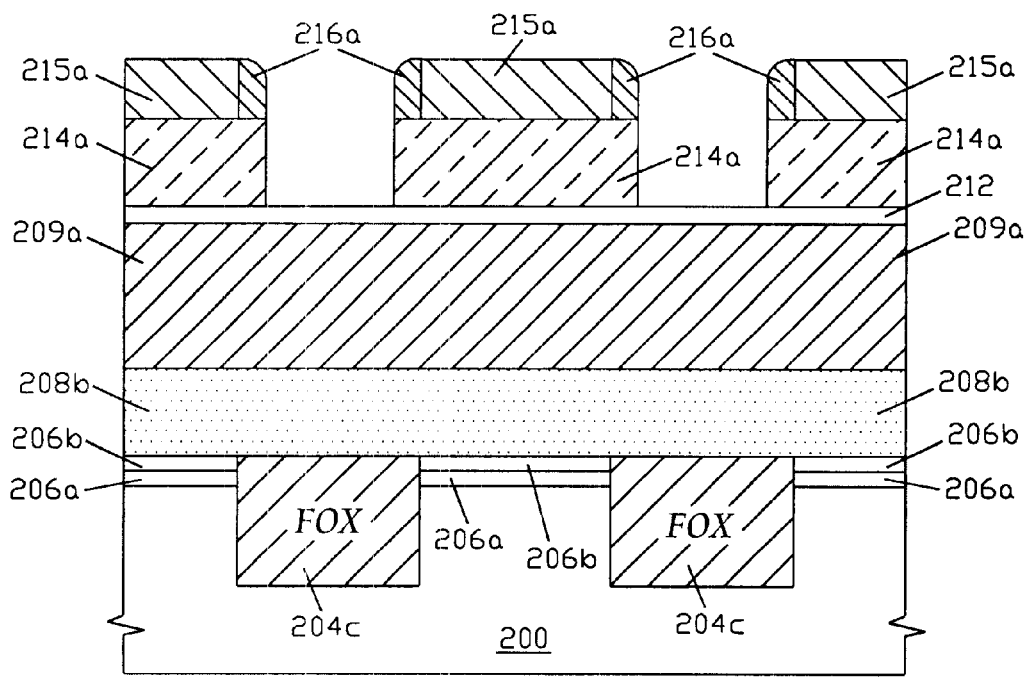
FIG. 5B(*a*) through FIG. 5B(*c*) show the cross-sectional views of a contactless dual-bit flash memory array of the present invention shown in FIG. 4I(*b*).
Figure 5B:
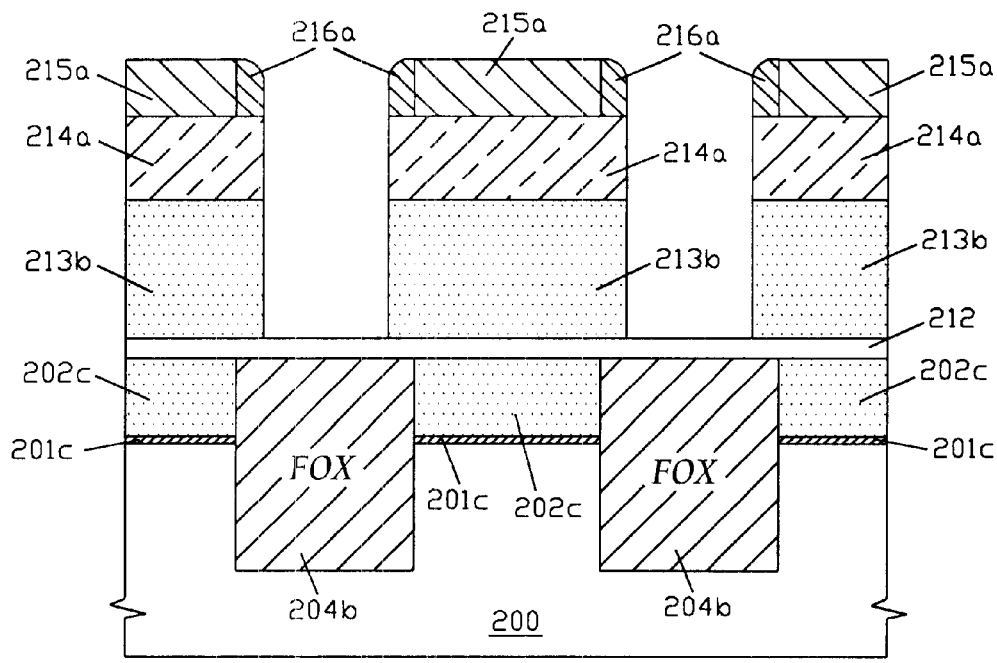
Figure 5B:
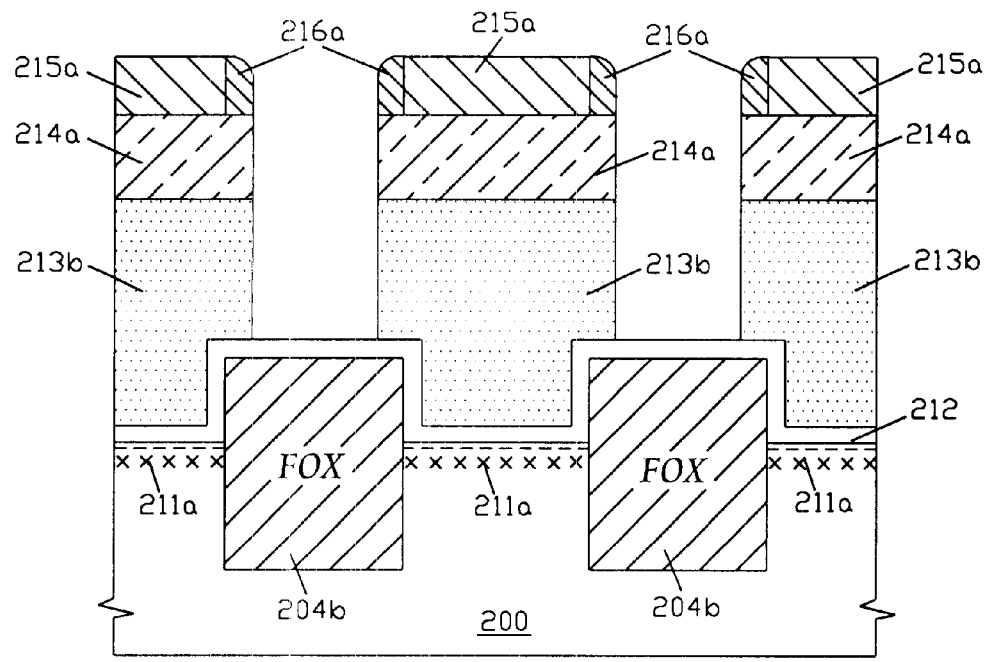

Similarly, FIG. 5B(a) through FIG. 5B(c) show the cross-sectional views of FIG. 4I(b), in which FIG. 5B(a) and FIG. 5B(c) are the same as those shown in FIG. 5A(a) and FIG. 5A(c) and their descriptions are neglected. FIG. 5B(b) shows a cross-sectional view along the C–C' line shown in FIG. 4I(b), in which the second sidewall dielectric spacer 210a shown in FIG. 5A(b) is replaced by the patterned planarized third conductive layers 213b. It is clearly seen that the third masking dielectric layer 215a is aligned above the active region and two sidewall dielectric spacers 216a are used to eliminate misalignment. It should be emphasized that there are several methods that can be used to form the second gate-dielectric layer 212 as described in FIG. 4G(a) and FIG. 4G(b), and the plots in the text are mainly addressed to the cases of ONO or nitride-oxide structure. If HITO oxide or thermal-oxide is used as the second gate-dielectric layer 212, the second gate-dielectric layer 212 shown in FIG. 5A(a) and FIG. 5B(a) does not exist. Similarly, if thermal-oxide is used as the second gate-dielectric layer 212, the second gate-dielectric layer 212 over the top of FOX and its sidewalls does not exist.

While the present invention has been particularly shown and described with a reference to the present examples and embodiments as considered as illustrative and not restrictive. Moreover, the present invention is not to be limited to the details given herein, it will be understood by those skilled in the art that various changes in form and details may be made without departure from the true spirit and scope of the present invention.

What is claimed is:

1. A scalable dual-bit flash memory cell, comprising:
 a semiconductor substrate of a first conductivity type;
 a cell region having an active region between two shallow-trench-isolation (STI) regions formed on said semiconductor substrate and being divided into three regions: a first-side region, a gate region, and a second-side region with said gate region being formed between said first-side region and said second-side region, wherein said active region has a first conductive layer formed on a first gate-dielectric layer and each of said STI regions has a raised field-oxide layer;
 a common-source/drain diffusion region of a second conductivity type being formed by implanting doping impurities into said active region of said first/second-side region in a self-aligned manner with said gate region as an implantation mask;
 a first sidewall dielectric spacer being formed over each sidewall of said gate region and on a portion of a first/second flat bed being formed by said common-source/drain diffusion region and nearby two etched raised field-oxide layers in said first/second-side region;
 a second conductive layer being formed over said first/second flat bed outside of said first sidewall dielectric spacer to act as a bit line;
 a planarized thick-oxide layer being formed over said second conductive layer and said first sidewall dielectric spacer in said first/second-side region;
 a pair of floating-gate layers being defined and patterned by a pair of second sidewall dielectric spacers formed over each inner sidewall of said gate region and on a flat surface formed by said first conductive layer and nearby said raised field-oxide layers, wherein said first conductive layer and said first gate-dielectric layer between the pair of second sidewall dielectric spacers are sequentially removed to form a select-gate region and an implanted region of said first conductivity type is formed in a self-aligned manner by implanting said doping impurities into said semiconductor substrate of said select-gate region;
 a second gate-dielectric layer being formed over said planarized thick-oxide layers, a pair of floating-gate structures, said raised field-oxide layers between said pair of second sidewall dielectric spacers, and a semiconductor surface between the pair of floating-gate layers; and
 a planarized third conductive layer together with a first interconnect-metal layer being formed over said second gate-dielectric layer and simultaneously patterned and etched to form a word line transversely to said bit lines by using a patterned hard masking layer, wherein said patterned hard masking layer comprises a masking dielectric layer being aligned above said active region and two sidewall dielectric spacers being formed over sidewalls of said masking dielectric layer.

2. The scalable dual-bit flash memory cell according to claim 1, wherein the pair of floating-gate structures comprises the pair of second sidewall dielectric spacers being remained on the pair of floating-gate layers.

3. The scalable dual-bit flash memory cell according to claim 1, wherein the pair of floating-gate structures comprises the pair of floating-gate layers with the pair of second sidewall dielectric spacers being removed before forming said second gate-dielectric layer.

4. The scalable dual-bit flash memory cell according to claim 1, wherein said first gate-dielectric layer is acted as a tunneling-dielectric layer and is preferably a thermal-oxide layer or a nitrided thermal-oxide layer having a thickness between 80 Angstroms and 120 Angstroms.

5. The scalable dual-bit flash memory cell according to claim 1, wherein said first gate-dielectric layer is acted as a storage element and is preferably a composite dielectric layer of an oxide-nitride-oxide structure or a nitride-oxide structure having an equivalent oxide thickness between 50 Angstroms and 100 Angstroms.

6. The scalable dual-bit flash memory cell according to claim 1, wherein said first sidewall dielectric spacer is preferably made of silicon-oxides as deposited by low-pressure chemical-vapor-deposition (LPCVD) and its spacer width is preferably between 100 Angstroms and 1000 Angstroms.

7. The scalable dual-bit flash memory cell according to claim 1, wherein said second conductive layer is preferably made of doped polycrystalline-silicon as deposited by LPCVD and is further implanted with a high-dose of said doping impurities to act as a dopant diffusion source for forming a heavily-doped diffusion region of said second conductivity type within each of said common-source/drain diffusion regions.

8. The scalable dual-bit flash memory cell according to claim 1, wherein said implanted region in said select-gate region comprises a shallow implant region for threshold-voltage adjustment and a deep implant region for forming a punch-through stop.

9. The scalable dual-bit flash memory cell according to claim 1, wherein said second gate-dielectric layer is preferably a silicon-dioxide layer deposited by high-temperature-oxide (HTO) or a composite dielectric layer such as an oxide-nitride-oxide structure or a nitride-oxide structure having an equivalent oxide-thickness between 150 Angstroms and 300 Angstroms.

10. The scalable dual-bit flash memory cell according to claim 1, wherein said planarized third conductive layer is preferably a planarized doped polycrystalline-silicon layer capped with a self-aligned metal-silicide layer or a composite conductive structure having a planarized tungsten-silicide layer formed within a planarized doped polycrystalline- silicon layer.

11. The scalable dual-bit flash memory cell according to claim 1, wherein said second sidewall dielectric spacer is preferably made of silicon-nitrides or silicon-oxides as deposited by LPCVD.

12. A contactless dual-bit flash memory array, comprising:
   a semiconductor substrate of a first conductivity type;
   a plurality of parallel shallow-trench-isolation regions (STI lines) and a plurality of active regions (AA's) being formed alternately on said semiconductor substrate, wherein each of the plurality of parallel STI regions is filled with a raised field-oxide layer and each of the plurality of active regions is filled with a first conductive layer being formed over a first gate-dielectric layer;
   a plurality of common bus-line regions and a plurality of gate regions being formed alternately over said semiconductor substrate and transversely to the plurality of parallel STI regions, wherein the plurality of gate regions are formed by a masking photoresist step and are therefore scalable;
   a plurality of common-source/drain diffusion regions of a second conductivity type being formed in said semiconductor substrate of the plurality of active regions along each of the plurality of common bus-line regions;
   a first flat bed being formed in each of the plurality of common bus-line regions and being alternately formed by said common-source/drain diffusion region and an etched raised field-oxide layer;
   a first sidewall dielectric spacer being formed over each sidewall of the plurality of gate regions and on a portion of said first flat bed;
   a second conducive layer being formed over said first flat bed between a pair of said first sidewall dielectric spacers in each of the plurality of common bus-line regions to act as a bit line;
   a planarized thick-oxide layer being formed over said second conductive layer and the pair of said first sidewall dielectric spacers;
   a plurality of paired floating-gate layers being patterned by a pair of second sidewall dielectric spacers formed over each inner sidewall of each of the plurality of gate regions and on a flat surface alternately formed by said first conductive layer and said raised field-oxide layer;
   a plurality of implanted regions being formed in a self-aligned manner in said semiconductor substrate of said active regions between the pair of second sidewall dielectric spacers, wherein each of the plurality of implanted regions comprises a shallow implant region of said first conductivity type for threshold-voltage adjustment and a deep implant region of said first conductivity type for forming a punch-through stop;
   a second gate-dielectric layer being formed over said planarized thick-oxide layers, a plurality of paired floating-gate structures, said raised field-oxide layers between said pair of second sidewall dielectric spacers, and semiconductor surfaces between the pair of floating-gate layers, wherein each of the plurality of paired floating-gate structures comprises the plurality of paired floating-gate layers with or without the pair of second sidewall dielectric spacers; and
   a plurality of planarized control/select gate layers together with a plurality of first interconnect-metal layers being formed over said second gate-dielectric layer and simultaneously patterned and etched to form a plurality of word lines transversely to said bit lines by using a set of hard masking layers, wherein each of the set of hard masking layers being formed on each of the plurality of first interconnect-metal layers comprises a masking dielectric layer being aligned above said active region and two sidewall dielectric spacers being formed over sidewalls of said masking dielectric layer.

13. The contactless dual-bit flash memory array according to claim 12, wherein the pair of second sidewall dielectric spacers are preferably made of silicon-nitrides as deposited by LPCVD and are selectively removed before forming said second gate-dielectric layer.

14. The contactless dual-bit flash memory array according to claim 12, wherein the pair of second sidewall dielectric spacers are preferably made of silicon-nitrides or silicon-oxides and are remained on the plurality of paired floating-gate layers after forming said second gate-dielectric layer.

15. The contactless dual-bit flash memory array according to claim 12, wherein the pair of first sidewall dielectric spacers are preferably made of silicon-oxides as deposited by high-temperature oxide (HTO) method or LPCVD.

16. The contactless dual-bit flash memory array according to claim 12, wherein said first gate-dielectric layer is acted as a tunneling-dielectric layer and is preferably a thermal-oxide layer or a nitrided thermal-oxide layer having a thickness between 80 Angstroms and 120 Angstroms.

17. The contactless dual-bit flash memory array according to claim 12, wherein said first gate-dielectric layer is acted as a storage element and is preferably a composite dielectric layer of an oxide-nitride-oxide (ONO) structure or a nitride-oxide structure having an equivalent oxide thickness between 50 Angstroms and 100 Angstroms.

18. The contactless dual-bit flash memory array according to claim 12, wherein said second gate-dielectric layer is preferably a silicon-oxide layer having a thickness between 150 Angstroms and 500 Angstroms or a composite dielectric layer of an oxide-nitride-oxide structure or a nitride-oxide structure having an equivalent oxide thickness between 100 Angstroms and 500 Angstroms.

19. The contactless dual-bit flash memory array according to claim 12, wherein said second conductive layer is preferably made of doped polycrystalline-silicon layer and is further heavily implanted with a high dose of said doping impurities to act as a dopant diffusion source for forming a heavily-doped diffusion region of said second conductivity type within each of the plurality of common-source/drain diffusion regions.

20. The contactless dual-bit flash memory array according to claim 12, wherein each of the plurality of planarized control/select gate layers is preferably a planarized doped polycrystalline-silicon layer having a metal-silicide layer formed on its top or a planarized tungsten-silicide layer being formed within a planarized doped polycrystalline-silicon layer.

* * * * *